(12) United States Patent
Peng et al.

(10) Patent No.: US 10,910,300 B1
(45) Date of Patent: Feb. 2, 2021

(54) METHOD FOR MANUFACTURING INTERPOSER

(71) Applicants: QING DING PRECISION ELECTRONICS (HUAIAN) CO., LTD, Huaian (CN); Avary Holding (Shenzhen) Co., Limited., Shenzhen (CN)

(72) Inventors: Man-Zhi Peng, Huaian (CN); Rui-Wu Liu, Huaian (CN); Ming-Jaan Ho, New Taipei (TW)

(73) Assignees: QING DING PRECISION ELECTRONICS (HUAIAN) CO., LTD, Huaian (CN); Avary Holding (Shenzhen) Co., Limited., Shenzhen (CN)

(*) Notice: Subject to any disclaimer, the term of this patent is extended or adjusted under 35 U.S.C. 154(b) by 0 days.

(21) Appl. No.: 16/556,630

(22) Filed: Aug. 30, 2019

(30) Foreign Application Priority Data

Jul. 24, 2019 (CN) .......................... 2019 1 0669675

(51) Int. Cl.
| | |
|---|---|
| H01L 23/498 | (2006.01) |
| H01L 23/13 | (2006.01) |
| H05K 1/11 | (2006.01) |
| H05K 1/16 | (2006.01) |
| H01L 23/00 | (2006.01) |
| H05K 3/40 | (2006.01) |

(52) U.S. Cl.
CPC ........ *H01L 23/49827* (2013.01); *H01L 23/13* (2013.01); *H01L 23/49838* (2013.01); *H01L 24/32* (2013.01); *H01L 24/83* (2013.01); *H05K 1/112* (2013.01); *H05K 1/115* (2013.01); *H05K 1/16* (2013.01); *H05K 3/4007* (2013.01); *H01L 2224/83* (2013.01); *H05K 2201/09481* (2013.01); *H05K 2203/025* (2013.01)

(58) Field of Classification Search
CPC ............... H01L 24/32; H01L 23/49827; H01L 23/49838
See application file for complete search history.

(56) References Cited

U.S. PATENT DOCUMENTS

| | | | | |
|---|---|---|---|---|
| 9,397,035 | B2* | 7/2016 | Shen | ................. H01L 23/49866 |
| 9,685,399 | B2* | 6/2017 | Kimura | ............... H01L 25/0655 |

\* cited by examiner

*Primary Examiner* — Dale E Page
*Assistant Examiner* — Wilner Jean Baptiste
(74) *Attorney, Agent, or Firm* — ScienBiziP, P.C.

(57) ABSTRACT

A method for manufacturing an interposer to connect boards or elements with different pin or pad spacings comprises following steps. A mold with first and second plates is provided. The first plate defines a plurality of first units with a plurality of first holes, the second plate defines a plurality of second units with a plurality of second holes. Space between central lines of adjacent first holes is different from that of adjacent second holes. Conducting wires pass through the first holes and the second holes, and molding compound is injected into the mold to keep the conducting wires in place. A molded plate defining a plurality of plate units is thereby formed, and molded pieces constituting interposers are obtained by cutting the molded plate.

12 Claims, 8 Drawing Sheets

METHOD FOR MANUFACTURING INTERPOSER

FIELD

The subject matter herein generally relates to a method for manufacturing interposers to adapt and connect between components and/or boards with different pin or pad spacings.

BACKGROUND

An interposer can electrically connect a first circuit board or a first electronic component above and a second circuit board or a second electronic component below. However, such interposers are complex and difficult to manufacture.

BRIEF DESCRIPTION OF THE DRAWINGS

Implementations of the present technology will now be described, by way of embodiment, with reference to the attached figures.

DETAILED DESCRIPTION

Figure 1:
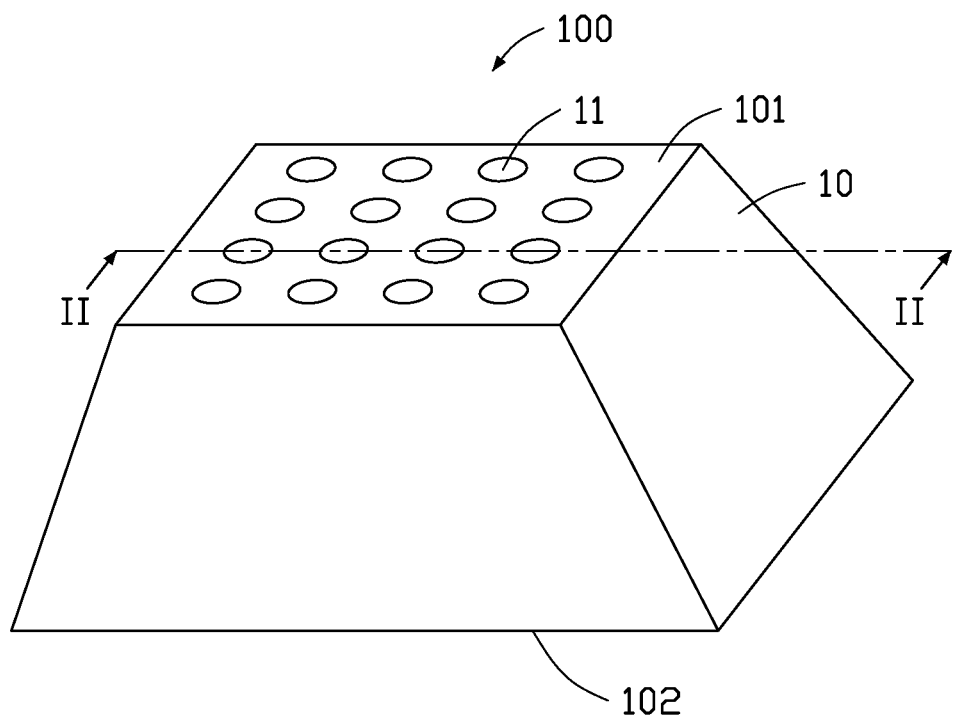
FIG. 1 is an isometric view of an embodiment of an interposer.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like.

Figure 2:
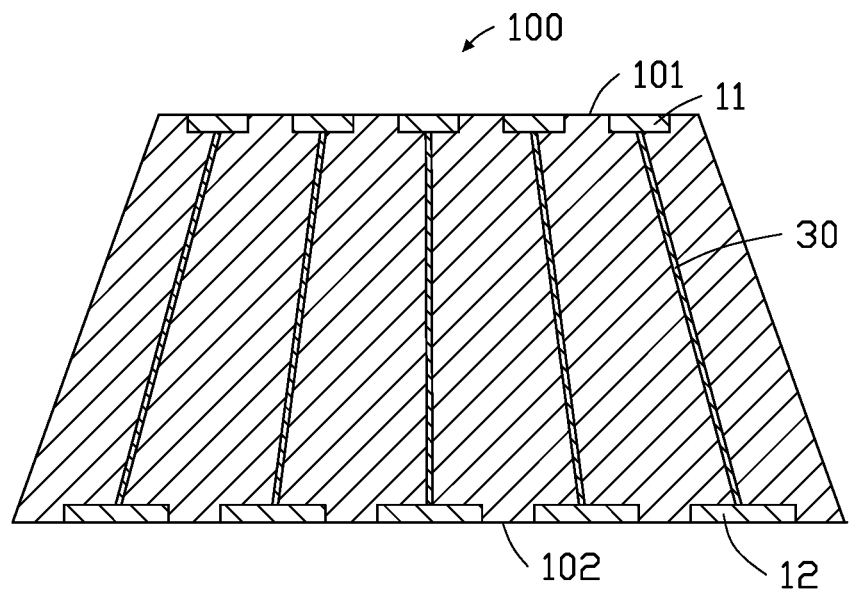
FIG. 2 is a cross-section view along line II-II of FIG. 1.

FIGS. 1 and 2 illustrate an embodiment of an interposer 100, configured to electrically connect boards and/or elements. The boards can be circuit boards, the elements can be electric components. In an alternative embodiment, the interposer 100 is configured to electrically connect a first element and a second element.

The interposer 100 comprises a molded piece 10 and a plurality of conducting wires 30 embedded into the molded piece 10.

The molded piece 10 can be made of poly ether ether ketone (PEEK), poly tetra fluoro ethylene (PTFE), poly phenylene sulfone resins (PPSU), liquid crystal polymer (LCP), poly phenylene sulfide (PPS), polytetrafluoro ethylene (PFA), ceramic powder, or other molding compound.

The molded piece 10 comprises a first surface 101 and a second surface 102 opposite to the first surface. An area of the first surface 101 is different from an area of the second surface 102. The molded piece 10 is substantially in a shape of a frustum of pyramid, and the area of the first surface 101 is less than an area of the second surface 102. In an alternative embodiment, a projection of the first surface 101 onto a plane of the second surface 102 is completely within in the second surface 102.

The first surface 101 carries a plurality of connecting pads 11, the second surface 102 carries a plurality of connecting pads 12. In an alternative embodiment, an area of the first connecting pad 11 is greater than an area of the second connecting pad 12. There is a first space between central lines of adjacent first connecting pads 11. In an alternative embodiment, the first space between adjacent first connecting pads 11 is equal. The first connecting pads 11 correspond one-to-one to a plurality of solder pads or component pins of the first element. That is, a space between central lines of adjacent solder pads of the first element is equal to the first space. There is a second space between central lines of adjacent second connecting pads 12. In an alternative embodiment, the second space between adjacent second connecting pads 12 is equal. The central lines of the first connecting pads 11 are parallel to the central lines of the second connecting pads 12. The second connecting pads 12 correspond one-to-one to a plurality of solder pads or component pins of the second element. That is, a space between adjacent solder pads of the second element is equal to the second space. The first space is different from the second space. In an alternative embodiment, the first space is less than the second space. The first connecting pads 11 can be connected to the solder pads of the first element. The second connecting pads 12 can be connected to the solder pads of the second element.

The first connecting pads 11 can protrude wholly or partially beyond the first surface 101, the first connecting pads 11 can be also embedded into the molded piece 10. The second connecting pads 12 can protrude wholly or partially beyond the second surface 102, the second connecting pads 12 can be also embedded into the molded piece 10.

The first connecting pads 11 and the second connecting pads 12 are made of copper, aluminum, silver, gold, copper alloy, aluminum alloy, or other conductive materials. In an alternative embodiment, respective resistances of the first connecting pads 11 and the second connecting pads 12 are less than 0.00001 ohm.

Each of the conducting wires connects one first connecting pad 11 and one second connecting pad 12. There is a third space between adjacent conducting wires 30 along a direction perpendicular to the central line of the first connecting pad 11 or perpendicular to the central line of the second connecting pad 12. A third space between adjacent conducting wires 30 is greater than a first space between two first connecting pads 11 connected to adjacent conducting wires 30, and is less than a second space between adjacent second connecting pads 12 connected to the two conducting wires 30. The adjacent conducting wires 30 are not parallel to each other. The third space between adjacent conducting wires 30 gradually becomes larger along an extending direction of the conducting wire 30 from the first connecting pad 11 to the second connecting pad 12.

The conducting wires 30 can be made of copper, aluminum, silver, gold, copper alloy, aluminum alloy, or other conductive materials. Respective resistances of the conducting wires 30 are less than 0.00001 ohm.

In an alternative embodiment, a cross section area of the conducting wire 30 is less than cross section areas of both the first and second connecting pads 11 and 12, to prevent short circuit caused by contact between adjacent conducting wires 30.

The interposer 100 comprises first connecting pads 11 and second connecting pads 12 arranged on opposite ends thereof, the space between adjacent first connecting pads 11 is different from the space between adjacent second connecting pads 12. Therefore, the interposer 100 can connect two elements with different pitch or pin spacings.

Figure 3:
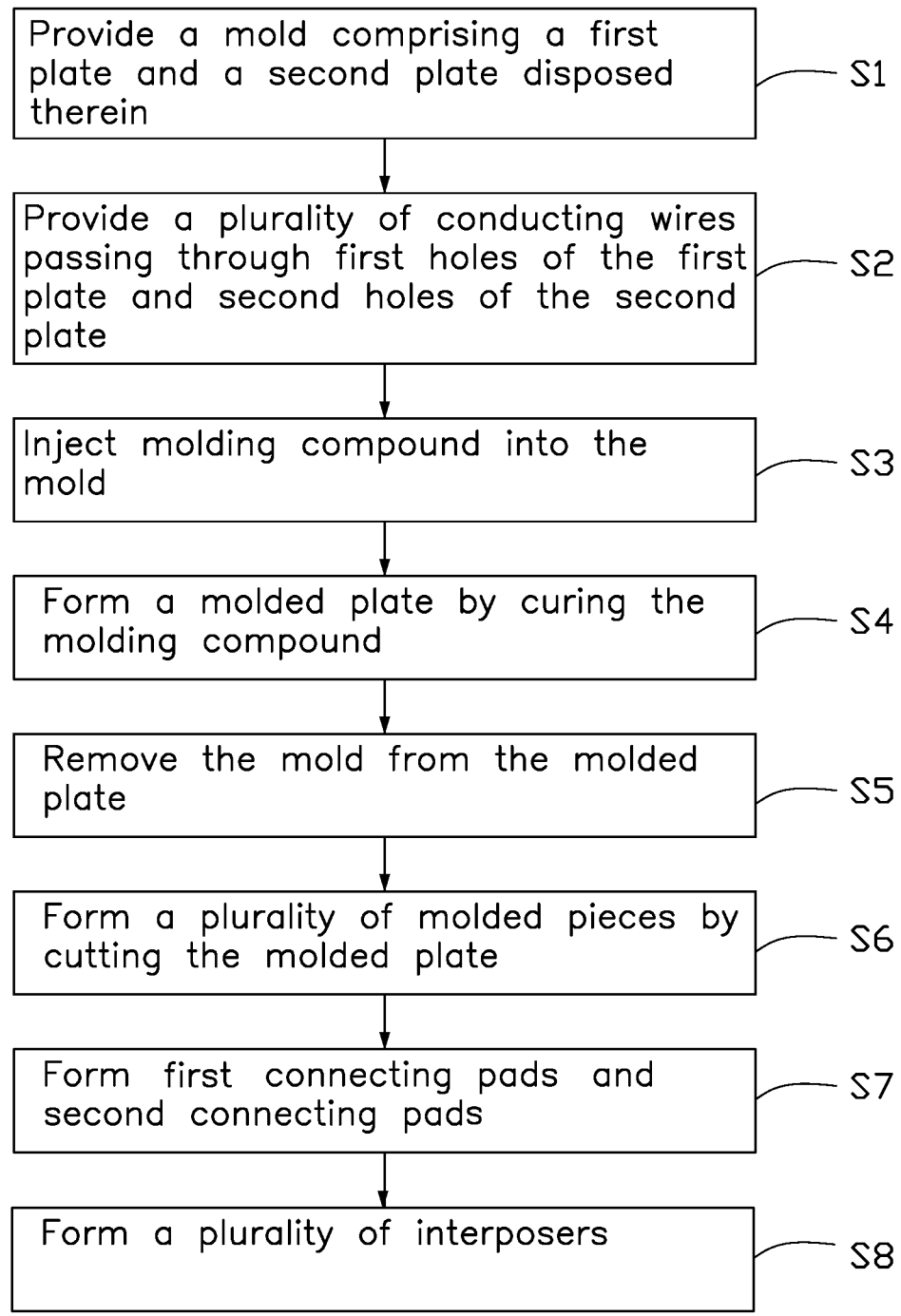
FIG. 3 is a flowchart of an embodiment of a method for manufacturing an interposer.

FIG. 3 illustrates the process and method for manufacturing the interposer in accordance with an example embodiment. The example method for manufacturing the adapter begins at block S1.

Figure 4:
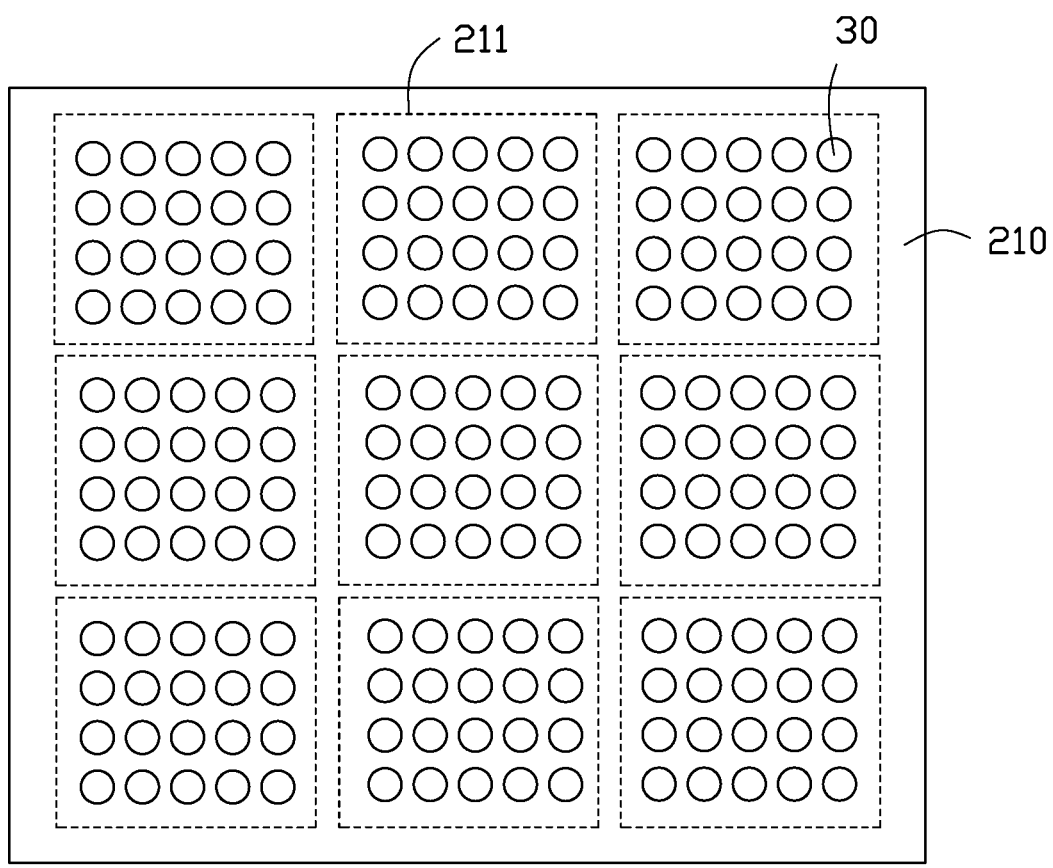
FIG. 4 is top view of an embodiment of a mold and conducting wires arranged in the mold.
Figure 5:
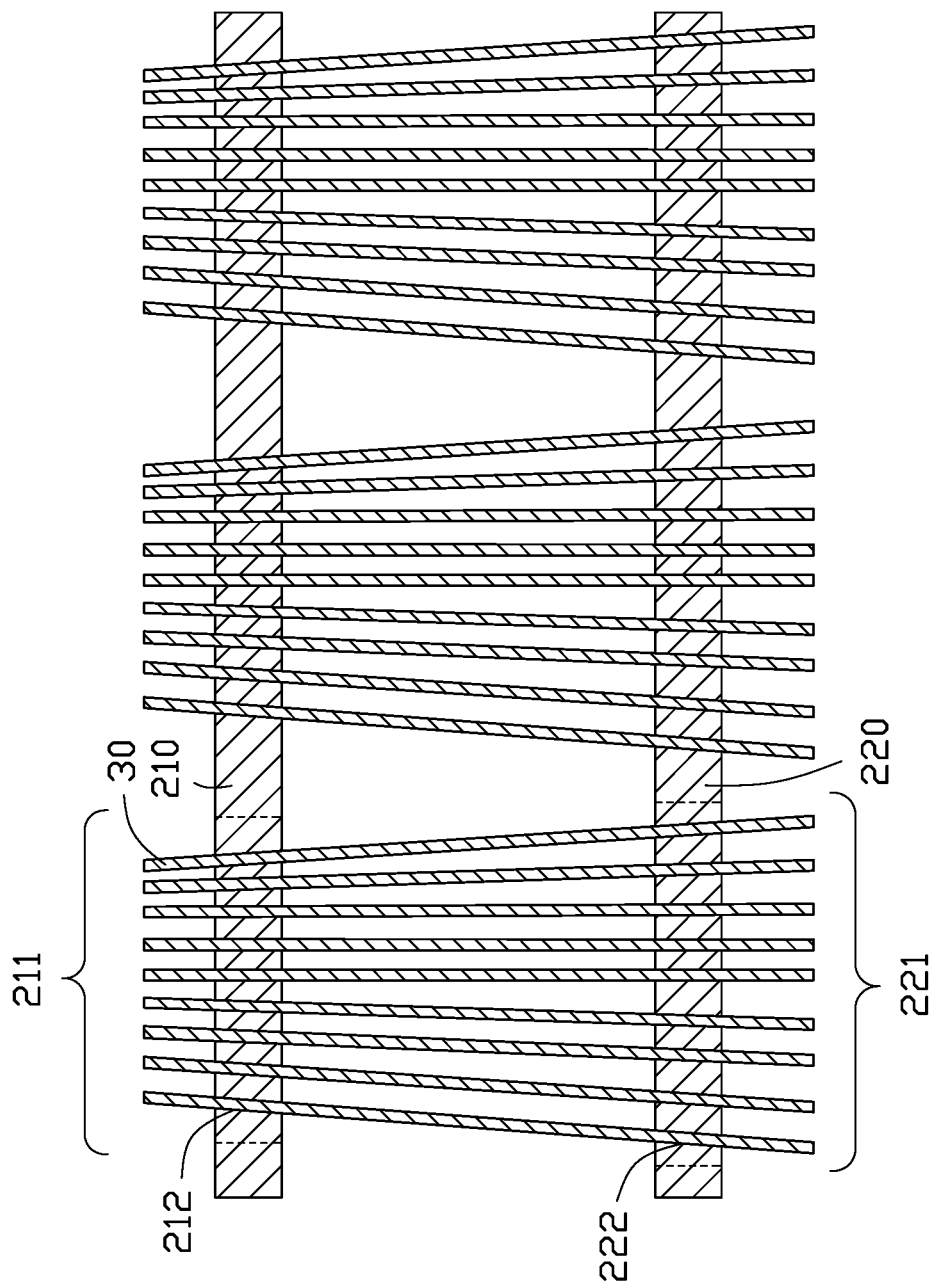
FIG. 5 is a cross-section of the mold and conducting wires of FIG. 3.

At block S1, referring to FIGS. 4 and 5, a mold is provided. The mold defines a molding cavity. The mold comprises a first plate 210 and a second plate 220 opposite to the first plate 210. The first plate 210 and the second plate 220 are both arranged in the molding cavity. The first plate 210 defines a plurality of first units 211 spaced away from each other. In an alternative embodiment, the first units 211 are arranged in a matrix. The second plate 220 defines a plurality of second units 221 spaced away from each other. In an alternative embodiment, the second units 221 are arranged in a matrix. Positions of the second units 221 correspond one-to-one to positions of the first units 211.

Each of the first units 211 defines a plurality of first holes 212, and each of the second units 221 defines a plurality of second holes 222. Positions of the first holes 212 correspond to positions of the first connecting pads 11, and positions of the second holes 222 correspond to positions of the second connecting pads 12. That is, a central line of each of the first holes 212 coincides with the central line of the corresponding first connecting pad 11, and a central line of each of the second holes 222 coincides with the central line of the corresponding second connecting pad 12. A space between central lines of adjacent first holes 212 is less than a space between central lines of two second holes corresponding to the adjacent first holes 212.

At block S2, also referring to FIGS. 4 and 5, a plurality of conducting wires 30 are provided, each of the conducting wires 30 passes through the first hole 212 and the corresponding second hole 222, and is fixed to the first plate 210 and the second plate 220.

The conducting wires 30 can be made of copper, aluminum, silver, gold, copper alloy, aluminum alloy, or other conductive materials. Resistance of each conducting wire 30 is less than 0.00001 ohm.

The space between the central lines of adjacent first holes 212 is less than the third space between two conducting wires 30 connected to the adjacent first holes 212, and the space between the central lines of adjacent second holes 222 is greater than the third space between two conducting wires 30 connected to the adjacent first holes 212.

The block S2 further comprises step of the conducting wires 30 being extended from the first holes 212 to the corresponding second holes 222, the third space between adjacent conducting wires 30 gradually becoming larger along extension directions of the conducting wires 30.

Figure 6:
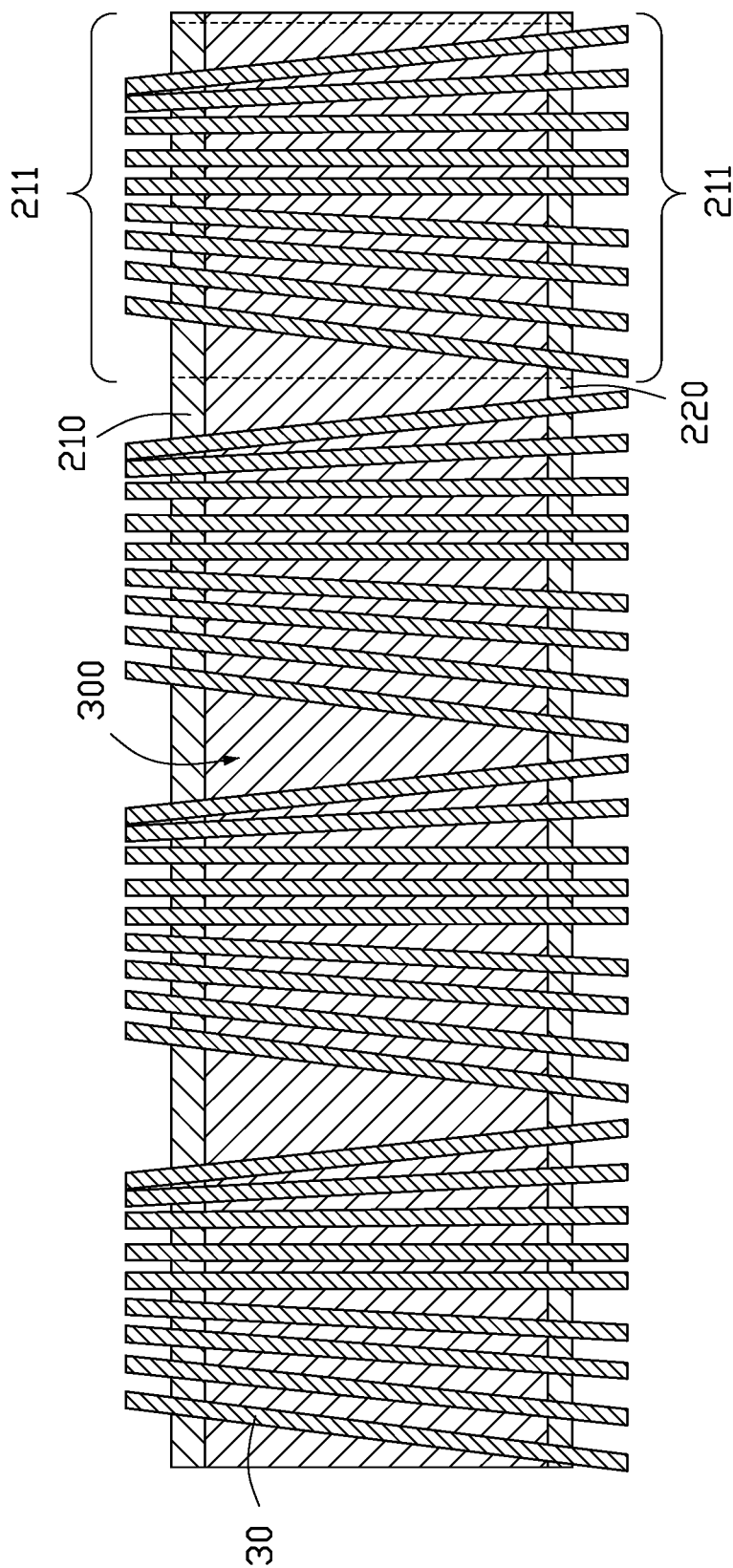
FIG. 6 is a cross-section of a molded plate formed after pouring insulation materials into the mold in FIG. 5.

At block S3, referring to FIG. 6, molding compound is injected into the molding cavity of the mold. The molding compound settles between the first plate 210 and the second plate 220, and is coated on outside surfaces of the conducting wires 30.

The molding compound can be poly ether ether ketone (PEEK), poly tetra fluoro ethylene (PTFE), poly phenylene sulfone resins (PPSU), liquid crystal polymer (LCP), poly phenylene sulfide (PPS), polytetrafluoro ethylene (PFA) or ceramic powder.

At block S4, a molded plate 300 is formed by curing the molding compound between the first plate 210 and the second plate 220. The molded plate 300 comprises the molding compound and the conducting wires 30 embedded into the molding compound.

The molded plate 300 defines a plurality of plate units 400. Each of the molded plate units 400 comprises the molding compound located between the first unit 211 and the corresponding second unit 221, and the conducting wires 30 embedded into the molding compound.

At block S5, the mold is removed from the molded plate 300.

The first plate 210 and the second plate 220 are removed by cutting opposite sides of the first plate 210 and the second plate 220 connected to the molded plate 300, to expose the molded plate 300.

The molded plate 300 can be exposed by a mechanized cutting process or a laser cutting process.

At block S6, referring to FIG. 6, a plurality of molded pieces 10 are formed by cutting the molded plate units 400 and the molded plate 300.

The molded pieces 10 are formed by cutting the molding compound of the molded plate 300 along a boundary of each of the molded plate units 400.

The boundary of each of the molded plate units 400 can be any one of lines between adjacent molded plate units 400. The molded plate 300 is cut into multiple parts with equal areas along the boundaries of the molded plate units 400, each of the portions being further cut to form the interposer 100.

The molded pieces 10 can be formed by a mechanized cutting process or a laser cutting process.

Figure 7:
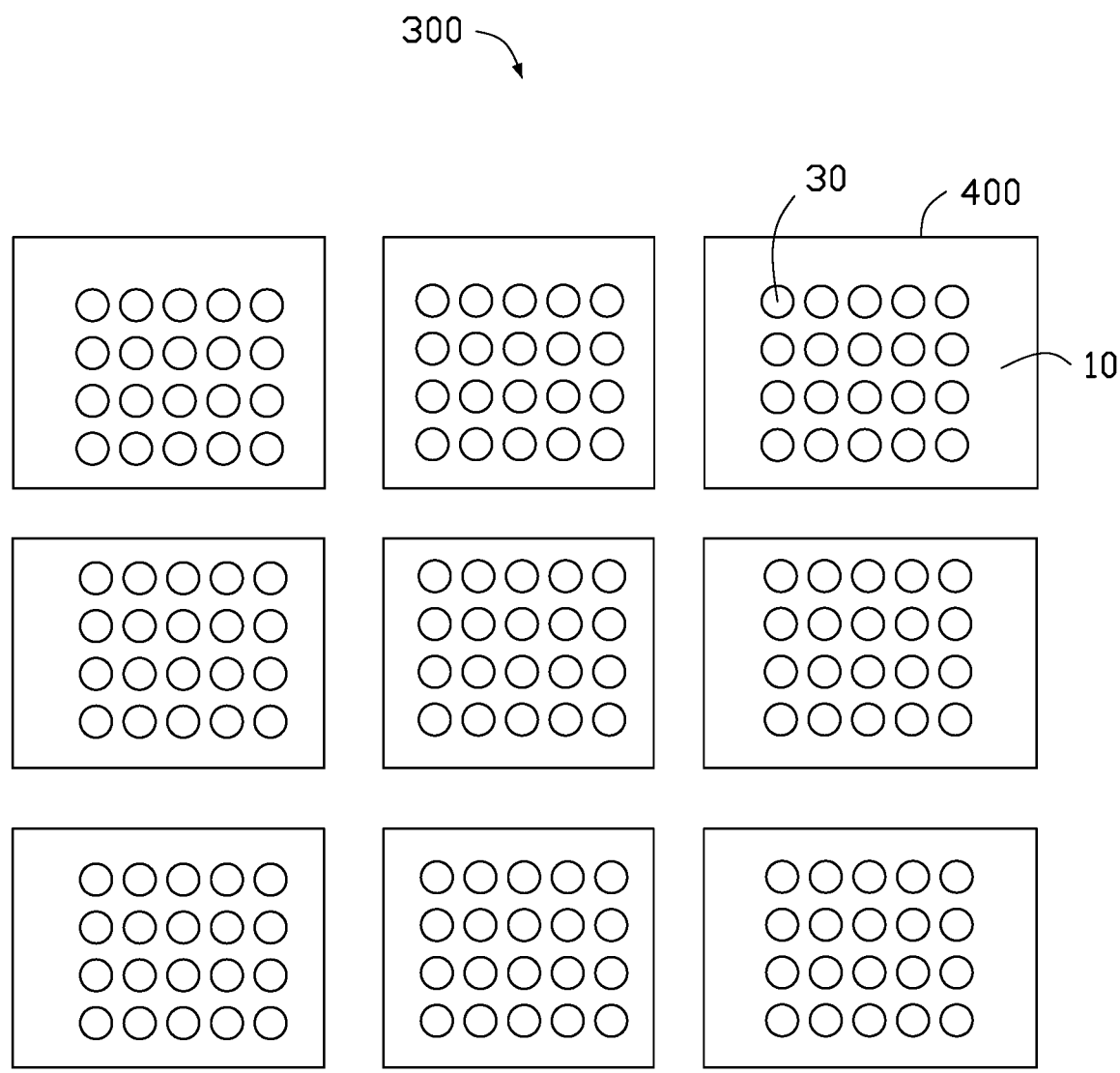
FIG. 7 is a top view of molded pieces formed after cutting the molded plate in FIG. 6.
Figure 8:
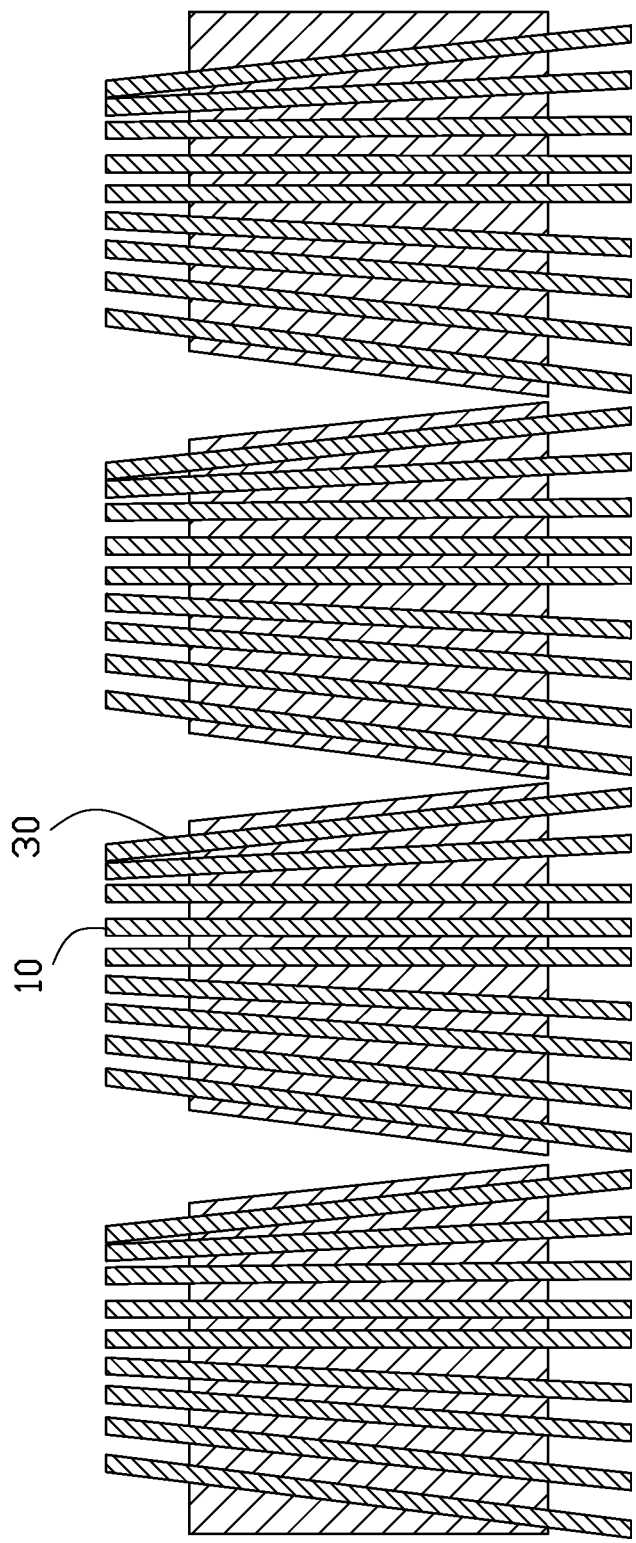
FIG. 8 is a cross-section view of molded pieces after cutting the molded plate in FIG. 7.

FIG. 7 illustrates that the molded pieces 10 are formed by cutting the molding compound of each of the molded plate units 400 along a direction parallel to an extension direction of the outermost conducting wires 30 in each of the molded plate units 400. The molded piece 10 is substantially in a shape of a frustum of pyramid.

At block S7, referring to FIG. 1, a plurality of first connecting pads 11 and a plurality of second connecting pads 12 are formed.

The block S7 comprises a first step of a plurality of first connecting pads 11 being formed on a first end of each of the molded pieces 10, and a plurality of second connecting pads 12 being formed on a second end of each of the molded pieces 10. Each first connecting pad 11 is electrically coupled to the corresponding second connecting pad 12 via the conducting wire 30.

The space between central lines of adjacent first holes 212 is less than the first space between two first connecting pads 11 corresponding to the adjacent first connecting pads 11, and the space between the central lines of adjacent second holes 222 is greater than the second space between two second connecting pads 12 corresponding to the adjacent second holes 222.

Grooves are formed on the first surface 101 and on the second surface 102 by ablating the molded piece 10 with a laser, molding compound is then filled into the grooves to form the first connecting pads 11 and the second connecting pads by electroplating, coating, or by other methods.

In an alternative embodiment, the first connecting pads 11 and the second connecting pads 12 can be formed by etching, electroplating, or other method.

The block S7 further comprises a second step of portions of the conducting wires 30 protruding outside of the molded piece 10 being removed. In an alternative embodiment, the portions of the conducting wires 30 protruding outside of the molded piece are removed by grinding the surfaces of the molded piece 10.

In an alternative embodiment, the second step of block S7 can be performed between the block S5 and the block S6. The portions of the conducting wires 30 protruding outside of the molded piece are removed by applying a grinding process to surfaces of the molded plate 300.

At block S8, a plurality of interposers 100 are formed.

The interposer 100 comprises the first surface 101 and the second surface 102 opposite to the first surface 101. The first surface 101 and the second surface 102 respectively correspond to the first unit 211 and the second unit 221 of the mold.

In the method for manufacturing the interposer, the interposer 100 is formed by pouring and cutting. The process of the method is simple, and the cost is reduced. The interposer 100 is obtained by being directly cut and separated along the extension direction of the conducting wire, thus subsequent dressing and cutting processes can be omitted.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure as defined by the appended claims.

What is claimed is:

1. A method for manufacturing an interposer comprising:
   providing a mold comprising a first plate and a second plate disposed therein, the first plate defining a plurality of first units spaced away from each other, the second plate defining a plurality of second units respectively corresponding to the plurality of first units, each of the first units defining a plurality of first holes, each of the second units defining a plurality of second holes respectively corresponding to the plurality of first holes, a space between central lines of adjacent first holes being different from a space between central lines of two second holes corresponding to the adjacent first holes;
   providing a plurality of conducting wires, each of the conducting wires passing through the first hole and the corresponding second hole and being fixed to the first plate and the second plate;
   injecting molding compound into the mold;
   forming a molded plate, the molded plate comprising the molding compound and the plurality of conducting wires embedded into the molding compound;
   removing the mold from the molded plate;
   forming a plurality of molded pieces by cutting the molded plate; and
   forming a plurality of interposers.

2. The method of claim 1, wherein the molded plate defines a plurality of plate units, the plurality of molded pieces are formed by cutting the molding compound of each of the plate units along a direction parallel to an extension direction of the outermost conducting wires in each of the plate units.

3. The method of claim 1, wherein each of the interposers comprises a first surface and a second surface opposite to the first surface, the first surface and the second surface respectively correspond to the first units and the second units.

4. The method of claim 3, wherein an area of the first surface is less than an area of the second surface, a projection of the first surface onto the second surface is completely within in the second surface.

5. The method of claim 1, wherein central lines of the plurality of first holes are parallel to central lines of the plurality of second holes, a space between the central lines of adjacent two of the first holes is less than a space between the central lines of two second holes corresponding to the adjacent two of the first holes.

6. The method of claim 1, wherein in the step of providing the plurality of conducting wires, the conducting wires extend from the first holes to the second holes, and a space between adjacent two of the conducting wires becomes larger along extension directions of the conducting wires.

7. The method of claim 1, further comprising a step before forming the plurality of interposers: forming a plurality of first connecting pads and a plurality of second connecting pads.

8. The method of claim 7, wherein forming a plurality of first connecting pads and a plurality of second connecting pads comprises forming a plurality of first connecting pads on a first end of each of the molded pieces, and forming a plurality of second connecting pads corresponding to the plurality of first connecting pads on a second end of each of the molded pieces.

9. The method of claim 8, wherein each of the first connecting pads is electrically coupled to the corresponding second connecting pad via the conducting wire.

10. The method of claim 7, wherein forming a plurality of first connecting pads and a plurality of second connecting pads comprises removing portions of the conducting wires protruding outside of each of the molded pieces.

11. The method of claim 10, wherein the portions of the conducting wires protruding outside of each of the molded pieces are removed by grinding.

12. The method of claim 1, wherein removing the mold from the molded plate comprises removing the first plate and the second plate by cutting opposite sides of the first plate and the second plate connected to the molded plate.

* * * * *